United States Patent
An et al.

(10) Patent No.: US 7,192,286 B2
(45) Date of Patent: Mar. 20, 2007

(54) PRINTED CIRCUIT BOARD AND AN IMAGE FORMING APPARATUS HAVING THE PRINTED CIRCUIT BOARD

(75) Inventors: Seung-deog An, Yongin-si (KR); Min-seon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/917,407

(22) Filed: Aug. 13, 2004

(65) Prior Publication Data

US 2005/0042892 A1    Feb. 24, 2005

(30) Foreign Application Priority Data

Aug. 21, 2003   (KR) ...................... 10-2003-0058069

(51) Int. Cl.
*H01R 12/00* (2006.01)
(52) U.S. Cl. .......................................... 439/55; 439/74
(58) Field of Classification Search ................ 439/55, 439/74, 700; 361/777
See application file for complete search history.

(56) References Cited

U.S. PATENT DOCUMENTS

| | | | | |
|---|---|---|---|---|
| 4,420,203 A | * | 12/1983 | Aug et al. | ...................... 439/71 |
| 5,376,998 A | | 12/1994 | Suzuki | ........................ 355/326 |
| 5,499,924 A | * | 3/1996 | Arisaka et al. | ................ 439/67 |
| 6,175,086 B1 | * | 1/2001 | Nakamura | .................... 174/261 |

FOREIGN PATENT DOCUMENTS

| | | |
|---|---|---|
| CN | 1220077 A | 6/1999 |
| JP | 01-093578 | 4/1989 |
| JP | 6-105829 | 4/1994 |
| JP | 08-334951 | 12/1996 |
| JP | 10-090968 | 4/1998 |
| KR | 1998-042767 | 8/1998 |
| KR | 1020000011055 | 2/2000 |

* cited by examiner

*Primary Examiner*—Khiem Nguyen
(74) *Attorney, Agent, or Firm*—Roylance, Abrams, Berdo & Goodman, L.L.P.

(57) ABSTRACT

Disclosed is a printed circuit board comprising a contact terminal, which prevents a poor contact and reduces a manufacturing cost, and an image forming apparatus having the same. The printed circuit board comprises a circuit part for controlling and processing an operation of electronic appliance, and a large-area contact terminal formed by a group of small-area terminals for electric connection with external device. The small-area terminals can be formed in various types, respectively having regular size and shape and being distanced a predetermined interval. Accordingly, unevenness of the large-area contact terminal surface caused by soldering is prevented since a plurality of small-area terminals constitute a unit contact terminal of over a predetermined size. Therefore, quality of contact with external terminal improves. Further, manufacturing cost is reduced, and the manufacturing process becomes simple.

20 Claims, 8 Drawing Sheets

PRINTED CIRCUIT BOARD AND AN IMAGE FORMING APPARATUS HAVING THE PRINTED CIRCUIT BOARD

CROSS-REFERENCE TO RELATED APPLICATIONS

This application claims the benefit under 35 U.S.C. § 119(a) of Korean Application No. 2003-58069, filed Aug. 21, 2003, in the Korean Intellectual Property Office, the disclosure of which is incorporated herein by reference in its entirety.

BACKGROUND OF THE INVENTION

1. Field of the Invention

The present invention relates to a printed circuit board (PCB) including a predetermined circuit with a contact terminal electrically connected to the circuit, and the printed circuit board installed in an image forming apparatus. More particularly, the present invention relates to a printed circuit board having a contact terminal larger than a predetermined size comprising a group of small-area terminals, which conduct an electrical signal.

2. Description of the Related Art

Generally, electronic appliances comprise a printed circuit board (PCB) within the electrical appliance on which a circuit is mounted for controlling and processing operation of the electronic appliances. On the PCB are mounted circuit elements, and a contact terminal which is electrically connected to circuits external to the PCB.

For instance, image forming apparatuses such as printers, copiers, and multifunctional office machines comprise a PCB as described above, and a consumables unit such as a developing unit and a photoconductive drum unit. The consumables units include a consumables unit terminal capable of allowing the exchange of signals with circuits within the consumables unit. When the consumables unit is mounted in the image forming apparatus, the consumables unit power terminal is supplied with power from a large-area contact terminal of the PCB. Power is supplied to the consumables by a moving pin contact in the main body of the image forming apparatus. In general, the moving pin contact is connected to the contact terminal of the PCB by a spring allowing for signal communications. By the elastic force of the spring, contact between the consumables unit power terminal and the moving pin allows the PCB to supply power to the consumables unit. Therefore, the contact terminal of the PCB has to have enough surface area for contact with the spring, and usually, a square terminal of about 7 mm to 12 mm in width is employed for this purpose. Hereinafter, the contact terminal of the above-described area of the PCB will be referred to as the large-area contact terminal for the convenience of explanation.

The large-area contact terminal provided on a conventional PCB can be fabricated by two methods. One is soldering a separate board-shaped metal terminal, and the other is using solder protrudingly applied on a board. When the board-shaped metal terminal is used for the large-area contact terminal, contact efficiency is superior, however, manufacturing cost increases. On the other hand, when using solder for the contact terminal, the manufacturing cost is relatively low.

FIGS. 1A and 1B illustrate the PCB 20 having the large-area contact terminal 21 formed by the solder, and a contact point of the PCB 20. As shown in FIGS. 1A and 1B, the large-area contact terminal 21 is formed by applying the solder to a predetermined area terminal on a rear surface of the printed circuit board 20 corresponding to a circuit element 27 mounted on the printed circuit board 20.

However, it is difficult using solder to form the large-area contact terminal 21 as above with a uniform thickness because the large-area contact terminal 21 is too wide, and the solder is input as a liquid. Therefore, the surface of the large-area contact terminal 21 becomes uneven. As a reference, a general soldering process creating a solder pattern width of approximately 2 mm typically guarantees a uniform thickness of solder. Accordingly, poor contact occurs between the large-area contact terminal 21 and an external terminal 30 due to the area of the large-area contact 21 being greater than 2 mm and the subsequent unevenness of the solder.

Other conventional solutions to the solder unevenness include forming a pattern on the PCB 20 without soldering, or soldering the pattern with a tape masking. However, in case of the former, the pattern is easily eroded. In case of the latter, when the tape is removed, solder remnants can be formed. This causes unstable contact between the large-area contact terminal 21 and the external terminal 30. Additionally, the manufacturing process is complicated and is costly.

SUMMARY OF THE INVENTION

The present invention has been made to overcome the above-mentioned problems of the prior art. Accordingly, it is an aspect of the present invention to provide a printed circuit board (PCB) having a contact terminal that prevents poor contact with an external terminal, and an image forming apparatus using the PCB.

In order to achieve the above-described aspects of the present invention, the PCB comprises: a PCB body; a first area disposed on a surface of the PCB body connected to a conductive member; and a second area disposed in the first area to be contacted to the conductive member. The second area is formed from a conductive material. A third area formed from a non-conductive material is disposed in the first area. Finally, a plurality of fourth areas are arranged in the second area in a group, wherein each area is a small-scale terminal unit. Each of the plurality of fourth areas is electrically connected in the PCB body, wherein the third area is arranged between the respective fourth areas. Each of the plurality of fourth areas has respectively a regular interval in between, and are formed by soldering.

The first area comprises the area covered by the plurality of fourth areas. To better visualize the first area, it comprises the area within an imaginary closed trace formed by connecting outermost unit fourth areas among the plurality of fourth areas.

The first area preferably has a substantially 7~12 mm diameter, and each of the fourth areas preferably has a diameter under 2 mm. The fourth area preferably further comprises a dummy part on the outer circumference of the first area which is preferably located at substantially the end of the solder path.

The dummy part may be formed by applying the solder on the outer circumference of the fourth areas without regard to their signal exchange capabilities.

In a preferred embodiment, a rear surface of the PCB body is soldered to fix a circuit element, and the fourth area is formed at the rear surface of the PCB body so that the soldering process for forming the fourth area and fixing the circuit element can be collectively performed.

In a preferred embodiment, the plurality of fourth areas are formed in either a circular or oblique pattern. The size of the fourth areas and the interval therebetween are determined corresponding to size of contacting surface of the first area and the external conductive member.

The first area is preferably equal to the sum of the second and the third area, and the second area is preferably equal to the sum of the plurality of fourth areas.

Preferably, the PCB comprises a plurality of the first areas on a surface.

A first line comprises at least two of the plurality of first areas corresponding to a first consumables unit.

Preferably, the first line includes three of the plurality of first areas, and a second line comprises at least two of the plurality of first areas corresponding to a second consumables unit.

A third line comprises at least two of the plurality of first areas corresponding to a third consumables unit.

An image forming apparatus according to an embodiment of the present invention comprises an image forming apparatus body and at least one consumables unit removably mounted in the image forming apparatus body. A consumables signal terminal is mounted in the consumables unit. A frame is mounted in the image forming apparatus body to guide insertion and separation of the consumables unit. A printed circuit board (PCB) is disposed in the frame with at least one contact terminal on a surface thereof. A moving pin is movably mounted in the frame, which contacts the consumables signal terminal when the consumables unit is connected. A spring mounted in the image forming apparatus body contacts the contact terminal, and elastically presses the moving pin toward the consumables unit. When the consumables unit is mounted in the image forming apparatus, a signal is transmitted to the PCB passed by the signal terminal of the consumables unit, the moving pin, the spring, and the contact terminal. The signal indicates that the consumables unit is mounted in the image forming apparatus.

The contact terminal of the PCB preferably is formed by a group of the small-area terminals.

In a preferred embodiment, the consumables unit mounting direction is perpendicular to a moving direction of the moving pin.

A guide rail is formed about at least one side of the consumables unit, and the consumables signal terminal is disposed on the guide rail. A guide face is preferably formed on a front of the guide rail to guide the moving pin in the mounting direction of the consumables unit when the consumables units are separated.

On the other hand, the spring is in a contact with the contact terminal both when the consumables unit is separated from and mounted in the image forming apparatus body.

Preferably, the spring is compressed further when the consumables unit is mounted. A moving extent of the moving pin corresponds to a length difference of the spring when the consumables unit is mounted and when it is separated.

At least one of the consumables signal terminals is a signal terminal that transmits information relating to the kind of consumables unit, and whether the consumables unit is used or new.

The at least one consumables signal terminal may include two signal terminals and one ground terminal.

The image forming apparatus body comprises a plurality of consumables units, and the PCB comprises a plurality of contact terminal units including at least one contact terminal corresponding to each of the plurality of consumables units.

The consumables units are preferably developing units including a toner for image printing.

According to another aspect of the present invention, an image forming apparatus comprises an image forming apparatus body and a printed circuit board (PCB) mounted in the image forming apparatus body. The PCB preferably has at least one contact terminal on a surface thereof. A consumables unit is preferably mounted in the image forming apparatus body with at least one moving pin mounted in the consumables unit. A spring is preferably mounted in the consumables unit so as to elastically press the moving pin to the contact terminal. A signal is transmitted to the PCB notifying the image forming apparatus of the mounting of the consumables unit., The signal is conducted via the spring, the moving pin, and the contact terminal. Each contact of the PCB comprises a group of small-area terminals spaced apart by a predetermined interval.

BRIEF DESCRIPTION OF THE DRAWING FIGURES

These and other features, aspects, and advantages of the present invention will become better understood with regard to the following description, appended claims, and accompanying drawing figures where:

DETAILED DESCRIPTION OF THE PREFERRED EMBODIMENTS

Hereinafter, the embodiments of the present invention will be described in detail with reference to the accompanying drawing figures.

FIGS. 2A to 2D show the exemplary large-area contact terminal formed by a group of small-area contact terminals according to an embodiment of the present invention.

The large-area contact terminal 151 according to an embodiment of the present invention is formed in a predetermined terminal area on the surface of a PCB 150 (See FIG. 5), and preferably electrically connected to at least one signal line on the PCB 150. The large-area contact terminal 151 comprises a group of small-area terminals 151a. The group of small-area terminals 151a are electrically connected to one another on the PCB 150, and formed by a solder applied on the PCB 150 during a soldering process to fix a circuit element 153 (see FIG. 5) on the PCB 150. In this case, each small-area terminal 151a preferably has approximately a 1.2 mm diameter R as shown in FIGS. 2A to 2D, therefore, the solder can be applied in regular thickness.

Figure 2A:
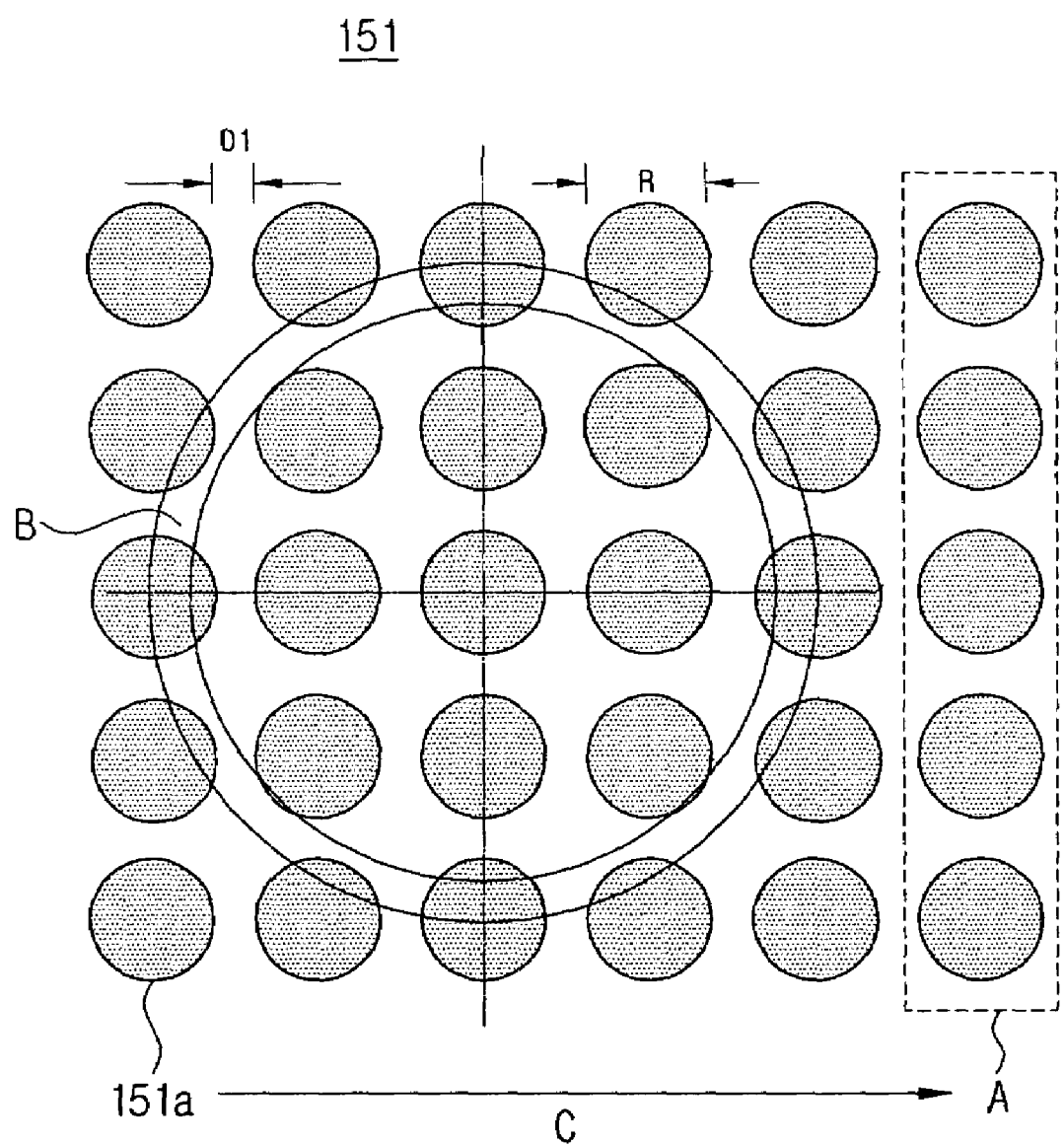
FIGS. 2A to 2D are plan views showing an exemplary large-area contact terminal formed by a group of small-area contact terminals according to preferred embodiments of the present invention.

Referring to FIG. 2A, the large-area contact terminal 151 is structured so that a plurality of circular small-area terminals 151a of a predetermined approximate size are arranged at a predetermined interval from one another in a predetermined terminal area. Each of the small-area terminals 151a has approximately a 1.2 mm diameter R and an approximate interval D1 of 0.4 mm from one another.

The small-area terminals 151a are provided by applying the solder to a copper clad pattern which is formed to provide the predetermined terminal area on the rear surface of the PCB 150. This soldering process can be collectively performed when the rear surface of the PCB 150 is soldered to fix the circuit element 153 (See FIG. 5) to the PCB 150. The small-area terminals 151a described above comprise the large-area contact terminal 151. This insures that the plurality of the small-area terminals 151a in the one large-area contact terminal 151 are electrically connected. In other words, electrical resistance between the small-area terminals 151a is preferably zero.

As described above, when the rear surface of the PCB 150 is soldered to fix the circuit element 153 and form the small-area terminal 151a, a dummy part A is formed at the end of the small-area terminals 151a along the solder input direction C. The dummy part A compensates for nonuniformity in the solder thickness that may occur during the soldering process. Dummy part A may be located at a location not in contact with the moving pin spring 131b when the moving pin spring 131b (See FIG. 5) is in contact with the large-area contact terminal 151. In addition, the dummy part A may not be electrically connected to the small-area terminal 151a.

As shown in FIG. 2A, the large-area contact terminal 151 is formed by applying the solder in a regular height along a predetermined arrangement forming a plurality of the small-area terminals 151a of a certain size and shape. Accordingly, poor contact between the moving pin spring 131b and the large-area contact terminal 151 can be prevented. Furthermore, since the small-area terminals 151a are electrically connected, the moving pin spring 131b and the large-area contact terminal 151 are also electrically connected as well.

Figure 2B:
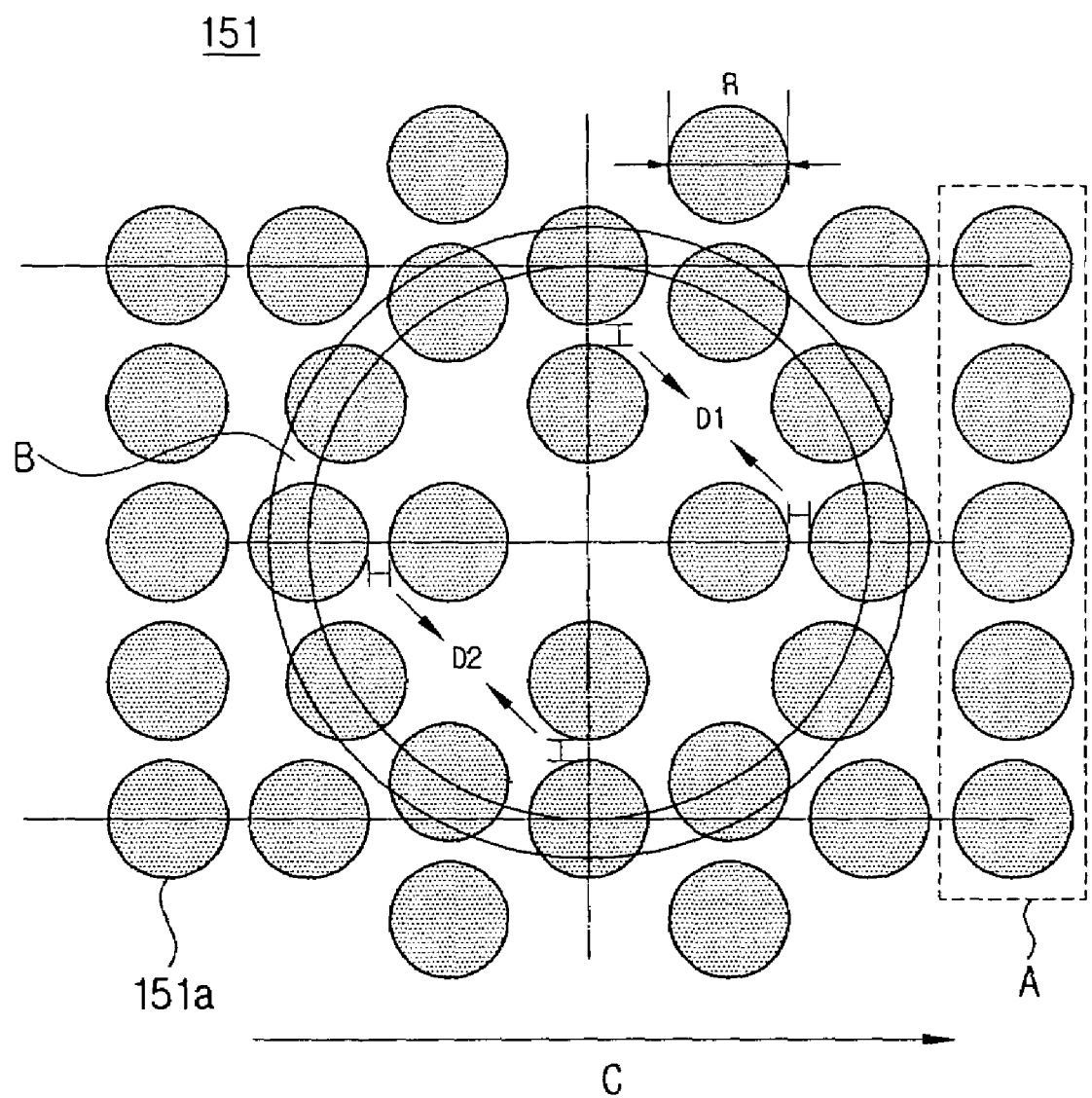

FIG. 2B illustrates another embodiment of the large-area contact terminal according to the present invention, which shows the large-area contact terminal 151 overlaying a circular cross-section of an external terminal, for example, moving pin spring 131b.

Referring to FIG. 2B, the terminal area of the large-area contact terminal 151 comprises a plurality of the small-area terminals 151a of a predetermined approximate size and shape distributed in a group. It is preferable that the small-area terminals 151a are compactly formed in a circular contact area B to which the external terminals contact, rather than the area outside of circular contact area B.

As illustrated, the small-area terminals 151a in the contact area B for contact with the external terminals preferably have substantially a 1.2 mm diameter R and an approximate interval D2 of 0.25 mm between one another. As in the former embodiment, a dummy part (not shown) may also be formed. Although small area terminals are shown to be circular in shape, any shape may be used so long as it has the proper area to conduct.

Figure 2C:
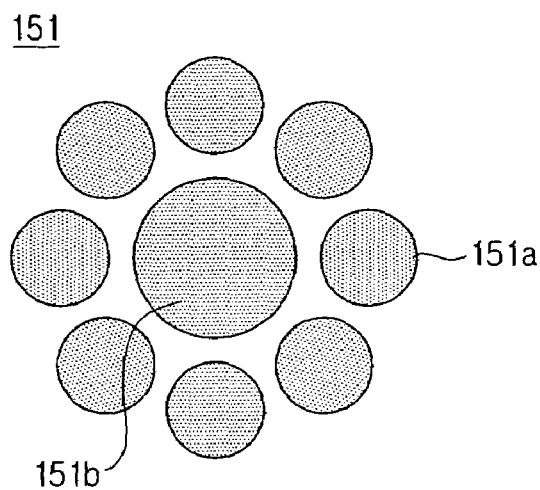

Referring to FIG. 2C, the large-area contact terminal 151 of the present embodiment has a circular terminal area. In the large-area contact terminal 151 area, a plurality of the small-area terminals 151a and 151b are arranged with a small-area terminal 151b in the center. The small-area terminals 151a may be arranged around the circumference of the small area terminal 151b at regular intervals. The small-area terminals are preferably larger than small-area terminals 151a.

Figure 2D:
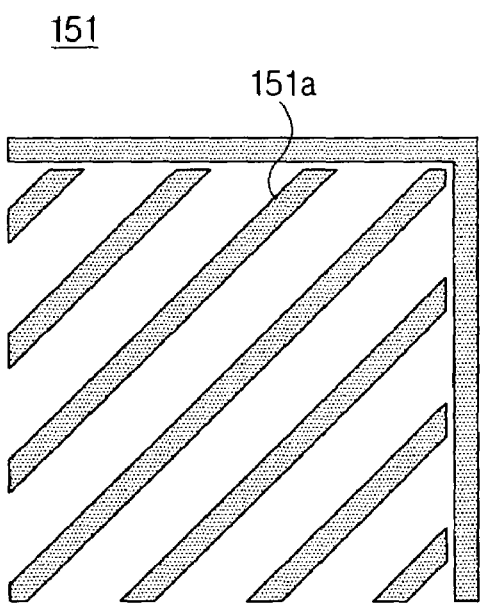

Referring to FIG. 2D, in the terminal area of the large-area contact terminal 151, a plurality of small-area terminals 151a are obliquely arranged having a regular width.

As described above, there are various shapes and sizes for the small-area terminals 151a grouped in the predetermined area to form the large-area contact terminal 151. Accordingly, the large-area contact terminal 151 can be formed from a variety of shapes and sizes of small-area terminals 151a.

According to the above, the predetermined area and the plurality of small-area terminals 151a may have more features. A first area of the terminal area in the large-area contact terminal 151 is always larger than a second area and a third area. Here, the second area is preferably an area of the small-area terminal 151a, and the third area is preferably the sum of areas of the respective small-area terminals 151a. Preferably, the first area is the sum of the third area and a fourth area. The fourth area is the area of an insulator disposed between the small-area terminals 151a.

Figure 1A:
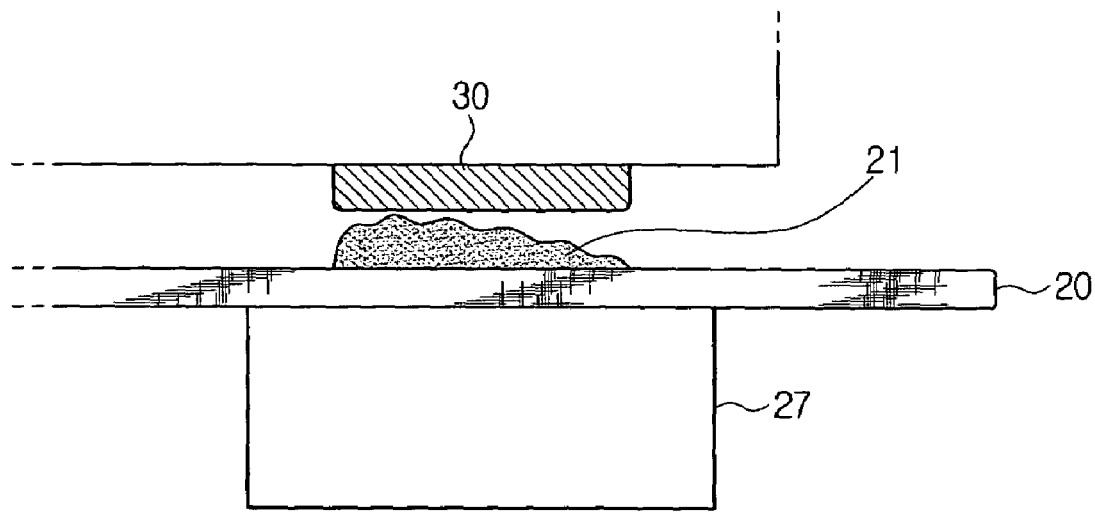
FIG. 1A shows a contact point state of a PCB having a general conventional large-area contact terminal formed by soldering.
Figure 1B:
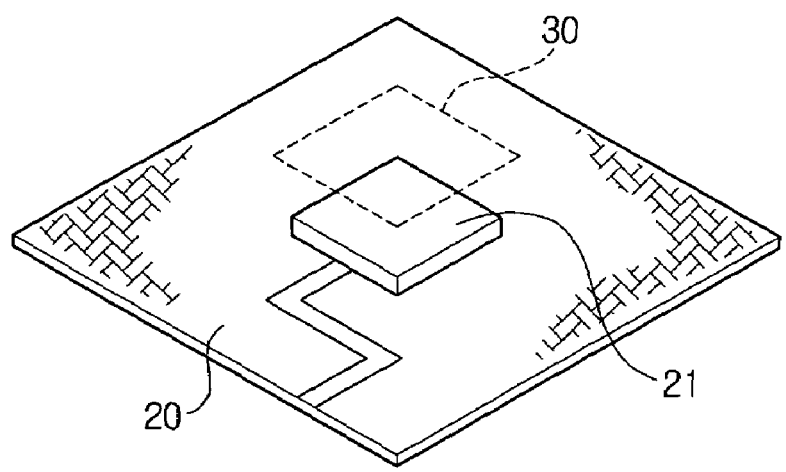
FIG. 1B is a perspective view schematically showing a general conventional PCB having the large-area contact terminal of FIG. 1A.

Since the above-structured large-area contact terminal 151 according to an embodiment of the present invention requires less solder than a conventional large-area contact terminal 21 (see FIG. 1A), the manufacturing cost can be greatly reduced. Further, the large-area contact terminal 151 can be collectively formed during the soldering process to fix the circuit element 153. Therefore, the manufacturing process is simplified.

Hereinafter, an example of an electronic appliance having the PCB will be described, which utilizes the large-area contact terminal according to the preferred embodiment of the present invention. An example of the electronic appliance may be an image forming apparatus, such as a printer, a copier, or a multifunction office machine, which will now be explained.

Figure 3:
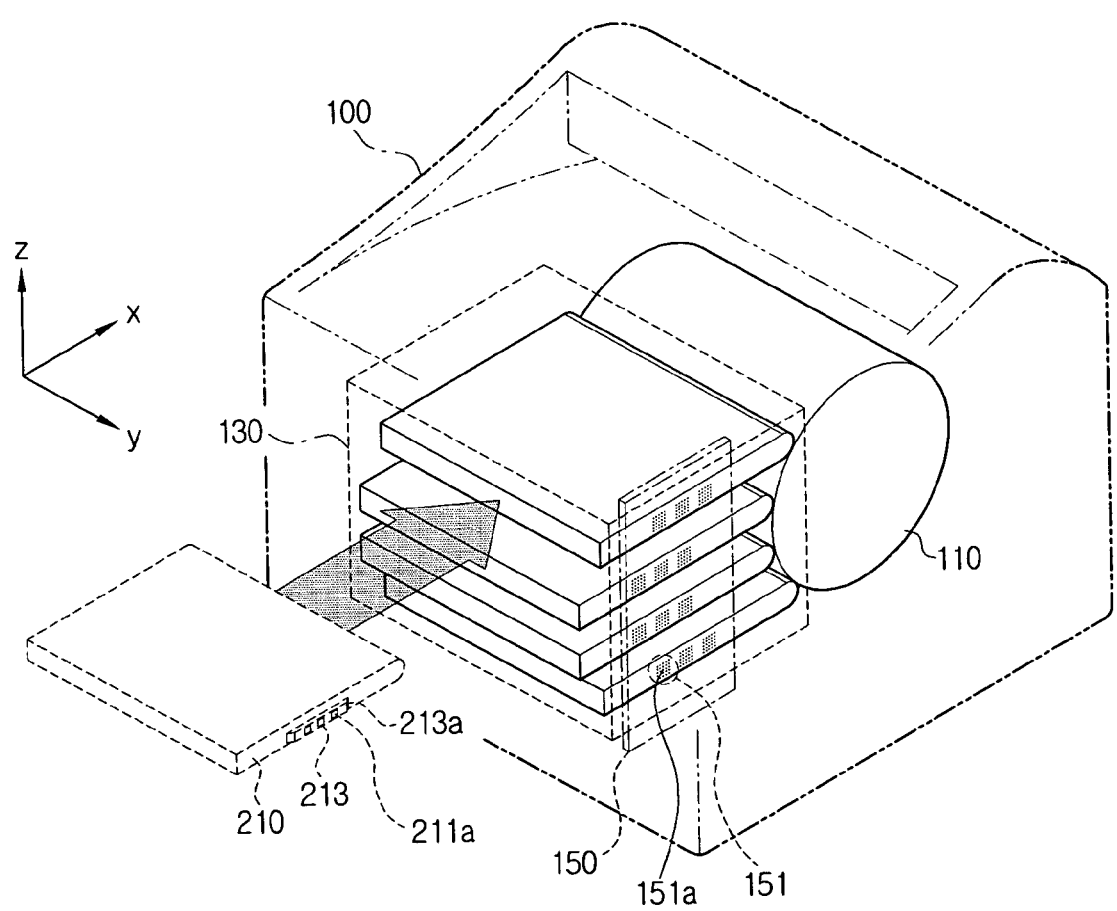
FIG. 3 is a view of an exemplary image forming apparatus having an exemplary PCB wherein the large-area contact terminal is mounted according to an embodiment of the present invention.

FIG. 3 is a view of an image forming apparatus having the PCB wherein the large-area terminal is mounted according to an embodiment of the present invention. In this embodiment, a color printer comprising a plurality of developing units for multicolor printing will be described as the image forming apparatus.

Referring to FIG. 3, the color printer comprises a printer body 100, a photoconductive drum 110, a plurality of developing units 210, a mounting portion frame 130, and a PCB 150. The plurality of developing units 210 receive toner, which is one of the consumable products. The mounting portion 130 is used to mount the plurality of developing units 210, which may be removed in the direction of the arrow X. The image forming apparatus via PCB 150 checks whether the plurality of developing units 210 are mounted in the mounting portion frame 130. A contact point state of the above developing unit 210 and the PCB 150 is illustrated in greater detail in FIGS. 4 and 5 and will now be described.

Figure 4:
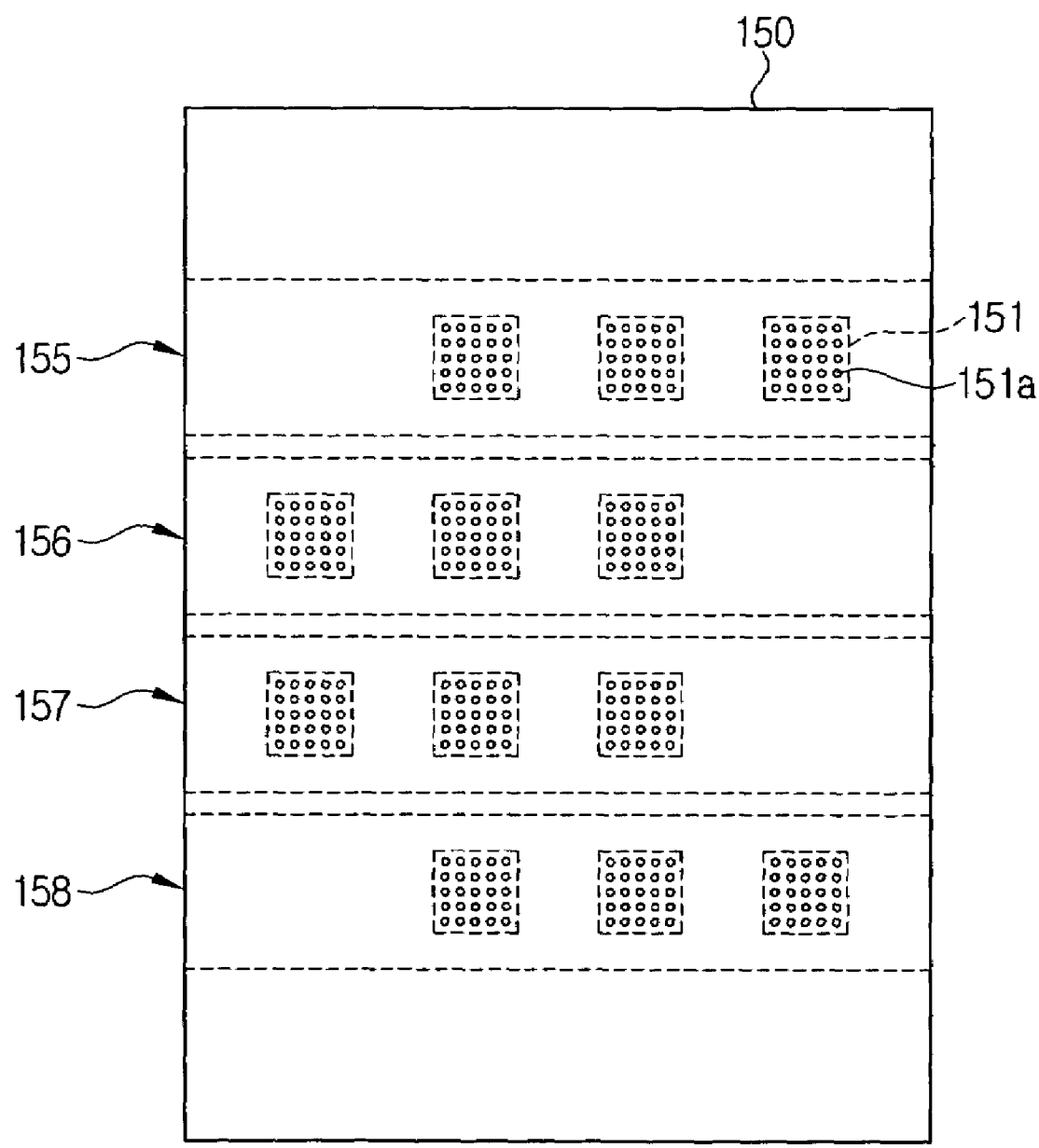
FIG. 4 is a detailed view of an exemplary PCB of FIG. 3 according to an embodiment of the present invention.

FIG. 4 illustrates the rear surface of the PCB 150 provided with plurality of the large-area contact terminals 151. The plurality of small-area terminals 151a shaped according to an embodiment shown in FIG. 2 are arranged to form one large-area contact terminal 151. Referring to FIG. 4, the PCB 150 comprises terminal units 155 through 158 corresponding to the respective developing units 210, and each of the terminal units 155 through 158 has the plurality of large-area contact terminals 151 formed from a group of the small-area terminals 151a. The terminal unit 155 at an uppermost line of FIG. 4, corresponds to a black developing unit, and has the large-area contact terminals 151 corresponding to a developing machine terminals 211a of the black developing unit which is the uppermost developing unit in FIG. 3. A second upper line terminal unit 156 corresponds to a cyan developing unit, and has the large-area contact terminals 151 corresponding to the developing machine terminals 221a of the cyan developing unit which is the second upper developing unit in FIG. 3. Also illustrated are terminal units 157, and 158 of PCB 150, corresponding to yellow and magenta developing units, respectively.

The terminal units 155 to 158 in the present embodiment respectively comprise three large-area contact terminals 151. This is because the respective developing units 210 comprise one fuse resistance for discerning a new developing machine, one sorting resistance for discerning sorts of the developing machine, and a circuit for grounding the respective resistances, and each ground of the resistances includes a circuit structure connected to one another. This is disclosed in detail in Korean Patent Application No. 2003-43998 (corresponding to U.S. Patent Publication No. 2004-0013447), which was filed by the assignee of the present application, and is incorporated herein by reference in its entirety. Therefore, a description of the specific structure and operation will be omitted herein.

Hereinbefore, only the embodiment wherein the PCB has four terminal units 155 to 158, and each terminal unit 155 to 158 has three large-area contact terminals 151, is described. However, the number and shape of the terminal units 155 to 158, and the large-area contact terminal 151 are changeable. Accordingly, the number and shape of the terminal units 155 to 158, and the large-area contact terminal 151 of the present invention, are not limited by the above embodiment.

One large-area contact terminal 151 forms a predetermined area with a plurality of small-area terminals 151a, however, it is noted that the one large-area contact terminal 151 is used for transmission of one signal. That is, the plurality of small-area terminals 151a constituting one large-area contact terminal 151 are electrically connected to one another to transmit one electrical signal. Additionally, on the PCB 150 surface, the small-area terminals 151a are also connected by the insulator filling between the respective small-area terminals 151a. Furthermore, one large-area contact terminal 151 can be used for any of a power terminal, a ground terminal, and signal terminal. In addition, according to the present invention, a plurality of circuit board terminals are mounted in one circuit board, corresponding to the plurality of developing machine terminals.

Figure 5:
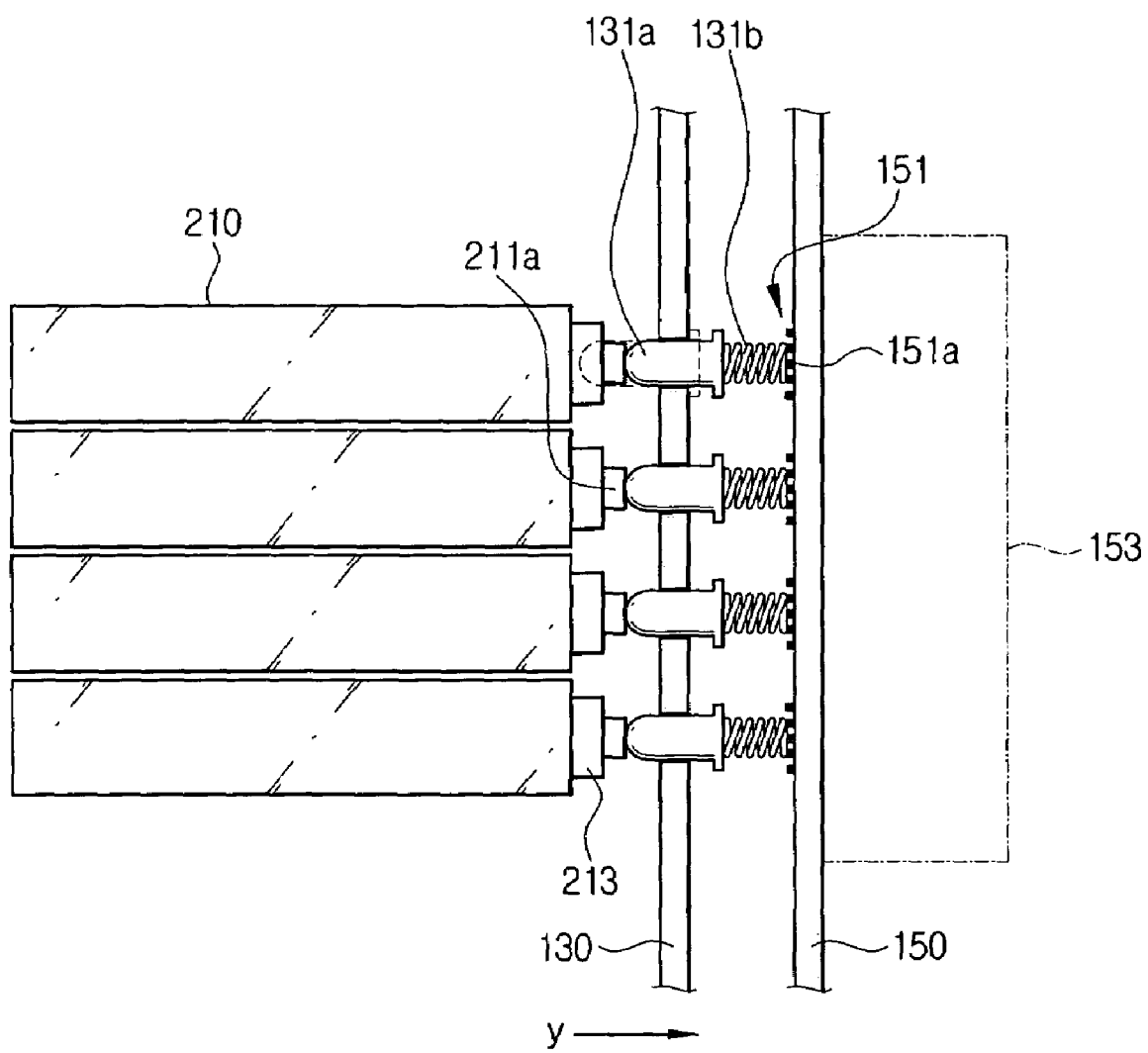
FIG. 5 is a view of an exemplary contact point state of a terminal unit of FIG. 3 according to an embodiment of the present invention.
Figure 6:
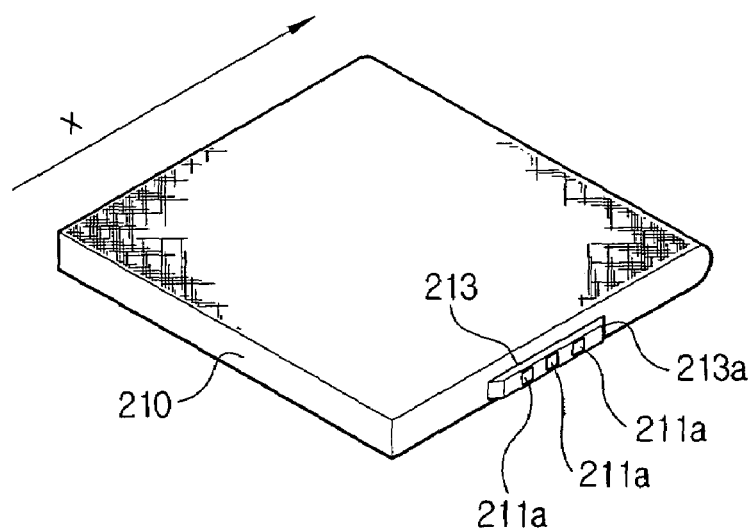
FIG. 6 is a perspective view of an exemplary developing unit of FIG. 3 according to an embodiment of the present invention.

FIG. 5 shows the contact point state of the above developing units and the PCB, and FIG. 6 shows an exterior of the developing unit according to the present embodiment.

Referring to FIGS. 5 and 6, the developing unit 210 in this embodiment comprises a guide rail 213, a guide face 213a, and a developing unit terminal 211a. The guide rail 213 facilitates mounting of the respective developing units 210 to the mounting portion frame 130 of the image forming apparatus body 100, and is protruded from a side of the developing unit 210. The side of the developing unit 210 mounts three developing unit terminals 211a. The guide face 213a is slantingly mounted on a front and a rear of the guide rail 213, and guides a main body moving pin 131a across a mounting direction of the developing unit 210 when the developing unit 210 is mounted. The main body moving pin 131a will now be described hereinbelow.

The image forming apparatus body 100 has the mounting portion frame 130, and the mounting portion frame 130 has the main body moving pin 131a protruded and penetrating therethrough. Through a main body moving pin spring 131b, the main body moving pin 131a is connected to the large-area contact terminal 151 of the PCB 150, and elastically pressed toward the developing unit 210. Both the main body moving pin 131a and the main body moving pin spring 131b are made of a conductive material such as a metal, thereby enabling power supplying, grounding and signal transmission when being connected to the developing machine terminal 211a.

Figure 7:
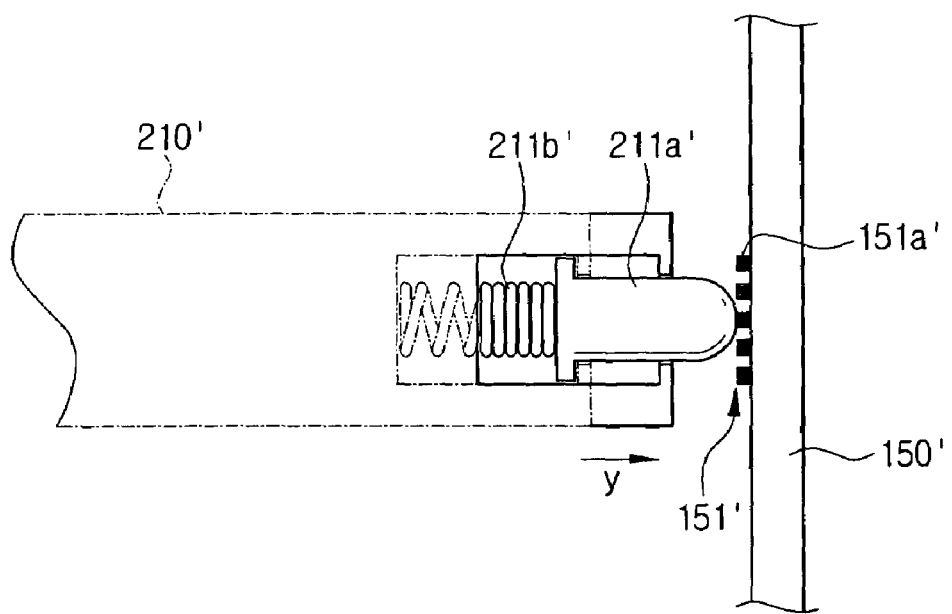
FIG. 7 is a view of an exemplary image forming apparatus mounting an exemplary developing unit according to an embodiment of the present invention.

FIG. 7 shows the main body moving pin and the main body moving pin spring mounted in the developing machine according to a fifth embodiment of the present invention.

Referring to FIG. 7, the image forming apparatus of this embodiment comprises a consumables moving pin 211a' mounted in the developing unit 210, and a developing unit moving pin spring 211b' elastically presses the consumables moving pin 211a' toward the large-area contact terminal 151' of the PCB 150'. FIG. 7 shows a state that the consumables moving pin 211a' is directly contacted with the large-area contact terminal 151' of the PCB 150'. Alternatively, a separate conductive member can be provided between the consumables moving pin 211a' and the large-area contact terminal 151'.

As above, the respective large-area contact terminals 151 and 151' are formed in the PCB 150 in the main body of the electronic appliance such as the image forming apparatus, by a group of small-area terminals 151a and 151a'. In addition, since the small-area terminals 151a and 151a' are formed by the solder applied in a predetermined height during the soldering process of the PCB 150 and 150', the surface of the contact terminal can be more even than the conventional one. Accordingly, contact efficiency between the external terminal and the large-area contact terminal is improved. Furthermore, solder consumption and manufacturing cost can be reduced due to the simplified manufacturing process while the product quality is improved.

Moreover, the PCB 150 and 150' according to the present invention mounts as much as large-area contact terminals 151 and 151' corresponding to the plurality of developing units 210 and 210' in one developing machine to realize a simpler, compacter, and less expensive image forming apparatus.

According to the present invention, an embodiment is introduced, wherein the developing unit mounting direction X is perpendicular to a moving direction Y of the developing machine checking terminal (here, the main body moving pin 131a). However, a case that the developing unit mounting direction of the developing machine and the moving direction are the same is included in the scope of the present invention.

In addition, although a color printer is taken as an example of the image forming apparatus, the present invention can be applied to a printer, a copier and a multifunction office machine, even regardless of a one-color printer or a multicolor printer.

According to the present invention, since the PCB 150' has a terminal, for processing one signal, constituted of the plurality of the small-area terminals 151a and 151a', the contact efficiency is improved.

Accordingly, a problem of the poor contact is solved. Furthermore, by soldering a plurality of small-area terminals at once, the manufacturing cost is lessened, and the manufacturing process is simplified.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A printed circuit board (PCB) comprising:
   a PCB body;
   a first area disposed on a surface of the PCB body and connected to conductive member;
   a second area disposed in the first area to be contacted to the conductive member, the second area being formed of a conductive material;
   a third area disposed in the first area, the third area being formed of a nonconductive material; and
   a plurality of fourth areas arranged in the second area in a group, wherein each fourth area is a small-scale terminal unit which is electrically connected to one another on the PCB body,
   wherein the third area is arranged between the respective fourth areas.

2. The PCB of claim 1, wherein the first area is an area within an imaginary closed curve formed by connecting outermost unit fourth areas among the plurality of fourth areas.

3. The PCB of claim 1, wherein the plurality of fourth areas respectively have a regular interval therebetween.

4. The PCB of claim 1, wherein the plurality of fourth areas are formed by soldering the first area in a predetermined pattern.

5. The PCB of claim 4, wherein each of the fourth areas has a diameter substantially in the 0.5~2 mm range.

6. The PCB of claim 4, further comprising a dummy part on an outer circumference of the first area which is corresponding to a down stream of the fourth areas along a solder input direction.

7. The PCB of claim 6, wherein the dummy part is formed by applying the solder on the outer circumference of the fourth areas with no regard to signal exchange of the fourth areas.

8. The PCB of claim 4, wherein a rear surface of the PCB body is soldered to fix a circuit element, and the fourth area is formed at the rear surface of the PCB body so that the soldering process for forming the fourth area and fixing the circuit element is collectively performed.

9. The PCB of claim 1, wherein the plurality of fourth areas are formed in either circular or oblique pattern.

10. The PCB of claim 1, wherein size of the fourth areas and the interval therebetween are determined corresponding to size of contacting surface of the first area and the external conductive member.

11. The PCB of claim 1, wherein the first area is the same as a sum of the second and the third area, and the second area is the same as a sum of the plurality of fourth areas.

12. The PCB of claim 1, wherein the PCB body comprises a plurality of the first areas.

13. The PCB of claim 12, comprising a first line constituted by at least two of the first areas corresponding to a first consumables unit.

14. The PCB of claim 13, wherein the first line includes three of the first areas.

15. The PCB of claim 12, comprising a second line constituted by at least two of the areas corresponding to a second consumables unit.

16. The PCB of claim 12, comprising a third line constituted by at least two of the first areas corresponding to a third consumables unit.

17. The PCB of claim 1, wherein the second area comprises a terminal area.

18. The PCB of claim 17, wherein the terminal area comprises a power terminal, a ground terminal, or a signal terminal.

19. The PCB of claim 17, wherein the plurality of small-scale terminal units are provided by applying solder to a copper clad pattern which is formed to provide the terminal area on the rear surface of the PCB.

20. The PCB of claim 1, wherein the small-scale terminal units are formed in a pattern to couple with an external terminal contact.

* * * * *